(12) United States Patent
Tung et al.

(10) Patent No.: US 7,704,772 B2
(45) Date of Patent: Apr. 27, 2010

(54) METHOD OF MANUFACTURE FOR MICROELECTROMECHANICAL DEVICES

(75) Inventors: Ming-Hau Tung, Santa Clara, CA (US); Brian James Gally, San Rafael, CA (US); Manish Kothari, Redwood City, CA (US); Clarence Chui, San Mateo, CA (US); John Batey, San Francisco, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 12/271,793

(22) Filed: Nov. 14, 2008

(65) Prior Publication Data
US 2009/0068781 A1 Mar. 12, 2009

Related U.S. Application Data

(63) Continuation of application No. 10/839,329, filed on May 4, 2004, now Pat. No. 7,476,327.

(51) Int. Cl.
*H01L 21/00* (2006.01)
(52) U.S. Cl. .................... 438/50; 257/E21.001
(58) Field of Classification Search ........... None
See application file for complete search history.

(56) References Cited

U.S. PATENT DOCUMENTS

| 3,728,030 A | 4/1973 | Hawes |
|---|---|---|
| 3,955,190 A | 5/1976 | Teraishi |
| 4,403,248 A | 9/1983 | te Velde |
| 4,425,572 A | 1/1984 | Takafuji et al. |
| 4,441,791 A | 4/1984 | Hornbeck |
| 4,672,254 A | 6/1987 | Dolat et al. |
| 4,681,403 A | 7/1987 | te Velde et al. |
| 4,786,128 A | 11/1988 | Birnbach |
| 4,859,060 A | 8/1989 | Katagiri et al. |
| 4,880,493 A | 11/1989 | Ashby et al. |
| 4,895,500 A | 1/1990 | Hok et al. |

(Continued)

FOREIGN PATENT DOCUMENTS

EP 0 071 287 2/1983

(Continued)

OTHER PUBLICATIONS

Wang et al., "Flexible Curcuit-Based RF MEMS Switches," Proceedings of 2001 ASME International Mechanical Engineering Congress and Exposition, pp. 757-762, Nov. 11-16, 2001.

(Continued)

*Primary Examiner*—Allan Olsen
(74) *Attorney, Agent, or Firm*—Knobbe Martens Olson & Bear LLP

(57) ABSTRACT

A method of manufacturing a microelectromechanical device includes forming at least two conductive layers on a substrate. An isolation layer is formed between the two conductive layers. The conductive layers are electrically coupled together and then the isolation layer is removed to form a gap between the conductive layers. The electrical coupling of the layers mitigates or eliminates the effects of electrostatic charge build up on the device during the removal process.

17 Claims, 4 Drawing Sheets

U.S. PATENT DOCUMENTS

| | | |
|---|---|---|
| 4,896,033 A | 1/1990 | Gautier |
| 4,954,789 A | 9/1990 | Sampsell |
| 4,956,619 A | 9/1990 | Hornbeck |
| 4,982,184 A | 1/1991 | Kirkwood |
| 5,014,259 A | 5/1991 | Goldberg et al. |
| 5,022,745 A | 6/1991 | Zayhowski et al. |
| 5,028,939 A | 7/1991 | Hornbeck et al. |
| 5,091,983 A | 2/1992 | Lukosz |
| 5,096,279 A | 3/1992 | Hornbeck et al. |
| 5,170,283 A | 12/1992 | O'Brien et al. |
| 5,285,196 A | 2/1994 | Gale |
| 5,315,370 A | 5/1994 | Bulow |
| 5,381,232 A | 1/1995 | Van Wijk |
| 5,452,138 A | 9/1995 | Mignardi et al. |
| 5,454,904 A | 10/1995 | Ghezzo et al. |
| 5,471,341 A | 11/1995 | Warde et al. |
| 5,485,304 A | 1/1996 | Kaeriyama |
| 5,526,172 A | 6/1996 | Kanack |
| 5,526,951 A | 6/1996 | Bailey et al. |
| 5,528,707 A | 6/1996 | Sullivan et al. |
| 5,559,358 A | 9/1996 | Burns et al. |
| 5,619,061 A | 4/1997 | Goldsmith et al. |
| 5,636,052 A | 6/1997 | Arney et al. |
| 5,638,946 A | 6/1997 | Zavracky |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,673,785 A | 10/1997 | Schlaak et al. |
| 5,677,783 A | 10/1997 | Bloom et al. |
| 5,710,656 A | 1/1998 | Goosen |
| 5,734,177 A | 3/1998 | Sakamoto |
| 5,771,321 A | 6/1998 | Stern |
| 5,786,927 A | 7/1998 | Greywall et al. |
| 5,795,208 A | 8/1998 | Hattori |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 5,881,449 A | 3/1999 | Ghosh et al. |
| 5,914,804 A | 6/1999 | Goossen |
| 5,920,418 A | 7/1999 | Shiono et al. |
| 5,949,571 A | 9/1999 | Goossen et al. |
| 6,002,661 A | 12/1999 | Abe et al. |
| 6,028,689 A | 2/2000 | Michalicek et al. |
| 6,040,937 A | 3/2000 | Miles |
| 6,055,090 A | 4/2000 | Miles |
| 6,065,424 A | 5/2000 | Shacham-Diamand et al. |
| 6,154,586 A | 11/2000 | MacDonald et al. |
| 6,262,697 B1 | 7/2001 | Stephenson |
| 6,323,923 B1 | 11/2001 | Hoshino et al. |
| 6,327,071 B1 | 12/2001 | Kimura |
| 6,353,489 B1 | 3/2002 | Popovich et al. |
| 6,356,378 B1 | 3/2002 | Huibers |
| 6,376,787 B1 | 4/2002 | Martin et al. |
| 6,384,952 B1 | 5/2002 | Clark et al. |
| 6,407,851 B1 | 6/2002 | Islam et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,535,663 B1 | 3/2003 | Chertkow |
| 6,556,338 B2 | 4/2003 | Han et al. |
| 6,574,033 B1 | 6/2003 | Chui et al. |
| 6,597,490 B2 | 7/2003 | Tayebati |
| 6,607,935 B2 | 8/2003 | Kwon |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,707,355 B1 | 3/2004 | Yee |
| 6,710,908 B2 | 3/2004 | Miles et al. |
| 6,787,438 B1 | 9/2004 | Nelson |
| 6,791,735 B2 | 9/2004 | Stappaerts |
| 6,794,119 B2 | 9/2004 | Miles |
| 6,807,892 B2 | 10/2004 | Biegelsen et al. |
| 6,813,059 B2 | 11/2004 | Hunter et al. |
| 6,841,081 B2 | 1/2005 | Chang et al. |
| 6,844,959 B2 | 1/2005 | Huibers et al. |
| 6,867,896 B2 | 3/2005 | Miles |
| 6,870,654 B2 | 3/2005 | Lin et al. |
| 6,876,047 B2 | 4/2005 | Cunningham et al. |
| 6,876,482 B2 | 4/2005 | DeReus |
| 6,882,458 B2 | 4/2005 | Lin et al. |
| 6,882,461 B1 | 4/2005 | Tsai et al. |
| 6,912,022 B2 | 6/2005 | Lin et al. |
| 6,917,268 B2 | 7/2005 | Deligianni et al. |
| 6,940,630 B2 | 9/2005 | Xie |
| 6,952,303 B2 | 10/2005 | Lin et al. |
| 6,958,847 B2 | 10/2005 | Lin |
| 6,980,350 B2 | 12/2005 | Hung et al. |
| 6,982,820 B2 | 1/2006 | Tsai |
| 7,034,981 B2 | 4/2006 | Makigaki |
| 7,053,737 B2 | 5/2006 | Schwartz et al. |
| 7,119,945 B2 | 10/2006 | Kothari et al. |
| 7,123,216 B1 | 10/2006 | Miles |
| 7,126,738 B2 | 10/2006 | Miles |
| 7,198,973 B2 | 4/2007 | Lin et al. |
| 7,221,495 B2 | 5/2007 | Miles et al. |
| 7,235,914 B2 | 6/2007 | Richards et al. |
| 7,236,284 B2 | 6/2007 | Miles |
| 7,372,619 B2 | 5/2008 | Miles |
| 7,460,291 B2 | 12/2008 | Sampsell et al. |
| 7,476,327 B2 | 1/2009 | Tung et al. |
| 2001/0001080 A1 | 5/2001 | Eldridge et al. |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0054424 A1 | 5/2002 | Miles |
| 2002/0070931 A1 | 6/2002 | Ishikawa |
| 2002/0075555 A1 | 6/2002 | Miles |
| 2002/0111031 A1 | 8/2002 | Chase et al. |
| 2002/0126364 A1 | 9/2002 | Miles |
| 2002/0146200 A1 | 10/2002 | Kurdle et al. |
| 2002/0149828 A1 | 10/2002 | Miles |
| 2002/0158348 A1 | 10/2002 | Petrucci et al. |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2004/0008396 A1 | 1/2004 | Stappaerts |
| 2004/0008402 A1 | 1/2004 | Patel et al. |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0058532 A1 | 3/2004 | Miles et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0107775 A1 | 6/2004 | Kim |
| 2004/0125281 A1 | 7/2004 | Lin et al. |
| 2004/0125282 A1 | 7/2004 | Lin et al. |
| 2004/0145811 A1 | 7/2004 | Lin et al. |

| | | | |
|---|---|---|---|
| 2004/0147198 A1 | 7/2004 | Lin et al. |
| 2004/0175577 A1 | 9/2004 | Lin et al. |
| 2004/0184134 A1 | 9/2004 | Makigaki |
| 2004/0207897 A1 | 10/2004 | Lin |
| 2004/0209195 A1 | 10/2004 | Lin |
| 2004/0217919 A1 | 11/2004 | Pichi et al. |
| 2004/0218251 A1 | 11/2004 | Piehl et al. |
| 2004/0240032 A1 | 12/2004 | Miles |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046922 A1 | 3/2005 | Lin et al. |
| 2005/0046948 A1 | 3/2005 | Lin |
| 2005/0078348 A1 | 4/2005 | Lin |
| 2005/0168849 A1 | 8/2005 | Lin |
| 2005/0195462 A1 | 9/2005 | Lin |
| 2006/0220160 A1 | 10/2006 | Miles |
| 2006/0262380 A1 | 11/2006 | Miles |
| 2006/0268388 A1 | 11/2006 | Miles |
| 2007/0177247 A1 | 8/2007 | Miles |
| 2008/0037093 A1 | 2/2008 | Miles |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0106782 A1 | 5/2008 | Miles |
| 2009/0080060 A1 | 3/2009 | Sampsell et al. |

FOREIGN PATENT DOCUMENTS

| | | |
|---|---|---|
| EP | 0 668 490 | 8/1995 |
| EP | 1 122 577 | 8/2001 |
| EP | 1 146 533 | 10/2001 |
| EP | 1 172 681 | 1/2002 |
| EP | 1 227 346 | 7/2002 |
| EP | 1 275 997 | 1/2003 |
| FR | 2 843 230 | 2/2004 |
| JP | 5-49238 | 2/1993 |
| JP | 5-281479 | 10/1993 |
| JP | 8-292382 | 11/1996 |
| JP | 11211999 | 8/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2004-012642 | 1/2004 |
| WO | WO 95/03562 | 2/1995 |
| WO | WO 98/52224 | 11/1998 |
| WO | WO 02/063682 | 8/2002 |
| WO | WO 02/079853 | 10/2002 |
| WO | WO 02/086582 | 10/2002 |
| WO | WO 03/041133 | 5/2003 |
| WO | WO 03/079384 | 9/2003 |
| WO | WO 2005/006364 | 1/2005 |

OTHER PUBLICATIONS

Conner, "Hybrid Color Display Using Optical Interference Filter Array," SID Digest, pp. 577-580 (1993).

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Miles, A New Reflective FPD Technology Using Interferometric Modulation, Journal of the SID, 5/4, 1997.

Office Action issued Dec. 26, 2006 in ROC App. No. 094114422.

ISR and WO for PCT/US2002/013462 filed Apr. 29, 2002.

IPRP for PCT/US02/013462 filed Apr. 29, 2002.

Kowarz et al., Conformal grating electromechanical system (GEMS) for high-speed digital light modulcation, Proceedings of the IEEEE 15th. Annual International Conference on Micro Electro Mechanical Systesm, MEMS 2002, pp. 568-573.

Miles, Interferometric modulation: MOEMS as an enabling technology for high performance reflective displays, Proceedings of SPIE, vol. 4985, pp. 131-139, 2003.

Panitz et al., Electrostatic actuated interference filters as optical switches for projection display applications, The 12th International Conference on Solid state Sensors, Actuators and Microsystems, Jun. 8-12, 2003, pp. 580-582.

Pape et al., Characteristics of the deformable mirror device for optical information processing, Optical Engineering, 22(6):674-681, Nov.-Dec. 1983.

Office Action dated Aug. 17, 2007 in U.S. Appl. No. 10/839,329.

Office Action dated Feb. 20, 2008 in U.S. Appl. No. 10/839,329.

First Office Action dated Feb. 27, 2009 in Chinese App. No. 200580013914.0.

Longhurst, 1963, Chapter IX: Multiple Beam Interferometry, in Geometrical and Physical Optics, pp. 153-157.

Tolansky, 1948, Chapter II: Multiple-Beam Interference, in Multiple-bean Interferometry of Surfaces and Films, Oxford at the Clarendon Press, pp. 8-11.

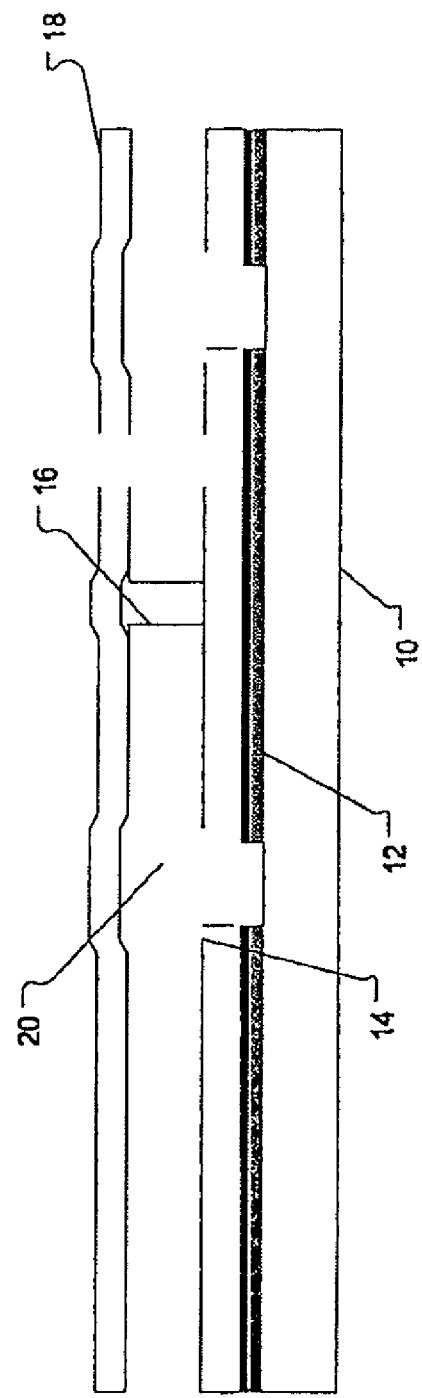
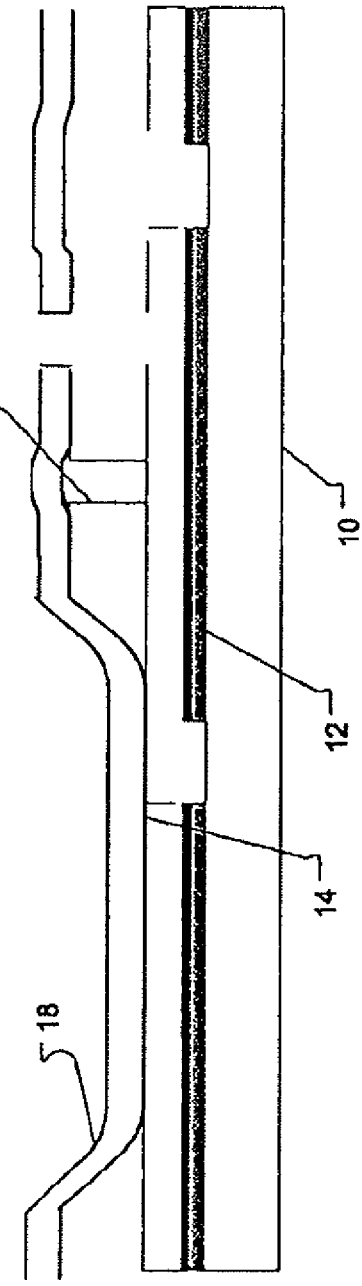
Figure 1
Figure 2

US 7,704,772 B2

METHOD OF MANUFACTURE FOR MICROELECTROMECHANICAL DEVICES

CROSS-REFERENCE TO RELATED APPLICATIONS

This application is a continuation of U.S. patent application Ser. No. 10/839,329, filed May 4, 2004, now U.S. Pat. No. 7,476,327, which is hereby incorporated by reference in its entirety.

BACKGROUND

Microelectromechanical system devices (MEMS) may be manufactured from thin film processes. These processes may involve a series of thin films deposited in layers, the layers being patterned and etched to form the devices. In order to allow the devices to move, one layer may be an isolation layer. An isolation layer is one that is used in forming the layers of the device acting as a structural member, but that may be removed when the device is complete.

Removal of the isolation layers may involve an etching process, using a material as the etchant that only acts on the sacrificial layer material. In some cases, the isolation layer may be an oxide that may be removed with a dry gas etch. Other forms of isolation layers are also possible, as are other methods of removal. The removal of the isolation layer typically results in a gap, through which a member of the device will move upon actuation.

MEMS devices often actuate through the use of electrical signals that cause a voltage differential between a first conductive layer and a second conductive layer separated by the gap. During dry, gas etching of the isolation layer, an electrostatic charge may build up on the layers, causing the movable member to become attracted to the other conductive layer. In extreme cases, the two layers may become stuck together and the device becomes inoperative. In less extreme cases, the movable element may become damaged or deformed and subsequently not operate correctly.

BRIEF DESCRIPTION OF THE DRAWINGS

The invention may be best understood by reading the disclosure with reference to the drawings, wherein:

FIG. 1 shows an embodiment of a microelectromechanical device formed using an isolation layer.

FIG. 2 shows an embodiment of a microelectromechanical device rendered inoperable by a static charge buildup during an etch process.

DETAILED DESCRIPTION OF THE EMBODIMENTS

Figure 3:
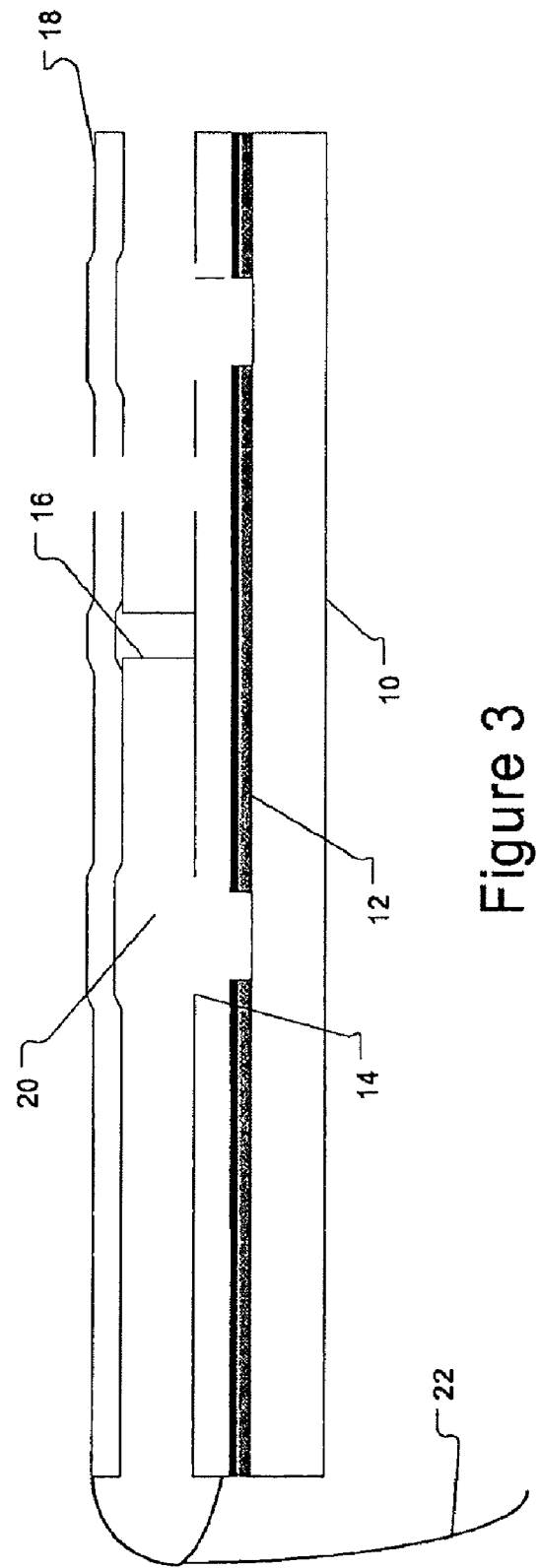
FIG. 3 shows an embodiment of an apparatus to mitigate the effects of static charge buildup during an etch process.

FIG. 1 shows an example of a microelectromechanical device that is formed from thin film processes including an isolation layer. This particular example is of an interferometric modulator, but embodiments of the invention may be applicable to all kinds of MEMS devices that are formed from thin film processes with an isolation layer. The modulator is formed on a transparent substrate 10. An optical stack typically comprising layers of metal and oxides such as 12 and 14 is formed upon the substrate 10. A metal membrane 18 is formed upon a sacrificial layer, not shown. The sacrificial layer may also be referred to as an isolation layer, as it acts to electrically isolate conductive layers from each other during processing. Prior to the formation of the membrane, vias are patterned into the isolation layer to allow metal from the membrane to fill in the vias and form posts, such as 16.

Upon completion of the modulator structures, such as the metal membrane 18, the isolation layer is removed. This allows portions of the membrane 18 to deflect towards the electrode layer 12 of the optical stack. In the case of interferometric modulators, the membrane 18 is attracted to the metal layer 12 by manipulation of the voltage differential between the membrane 18 and the electrode layer 12. The layer 12 and the membrane 18 may be metal, as discussed here, or any conductive material. The cell formed by the portion of the membrane shown in FIG. 1 is activated by applying a voltage to the conductive layer 14, which differs from the voltage of the membrane at 18. This causes the membrane to become electrostatically attracted to the electrode, or first conductive, layer 12. The conductive layers may be metal or any other conductive material.

During removal of the isolation layer, enough electrostatic charge can build up on the surfaces of the two conductive layers to cause the membrane to attract towards the conductive layer 14 without being activated. This condition is shown in FIG. 2. This is normally the activated state of the interferometric modulator, but the difference is that the membrane does not release from the oxide layer 12 upon changing of the voltage potential. The membrane has assumed the activated state permanently. This may be caused by a combination sticking and friction, often referred to as stiction, aggravated by the electrostatic forces between the conductive layer 12 and the conductive membrane 18.

Removal of the isolation layer may be achieved in many different ways. Typically, it is removed with the use of a dry, gas etch, such as a xenon-difluorine ($XeF_2$) etch. While these are examples of etching processes, any etch process may be used. It may be the dry environment that contributes to the build up of the electrostatic charge. However, it would be better to not have to change the materials or basis of the processes used to manufacture the MEMS devices, but instead to adapt the process to eliminate the electrostatic charge build up.

There are some benefits to be obtained by grounding the conductive layers during wet etch processes as well. There may be effects on the device electrochemistry that are either enabled, if desirable, or mitigated, if undesirable, by grounding. In one embodiment, the layers are grounded together, the isolation layers are removed and the grounding left in place so the devices can be safely transported without fear of electrostatic discharge. This would be helpful if the etch were a wet etch or a dry etch.

The grounding process may be an external grounding, by an apparatus or mechanism external to the structure of the device. Alternatively, the grounding may be as part of the internal structure of the device enabled during manufacture. Initially, external grounding will be discussed.

Figure 4:
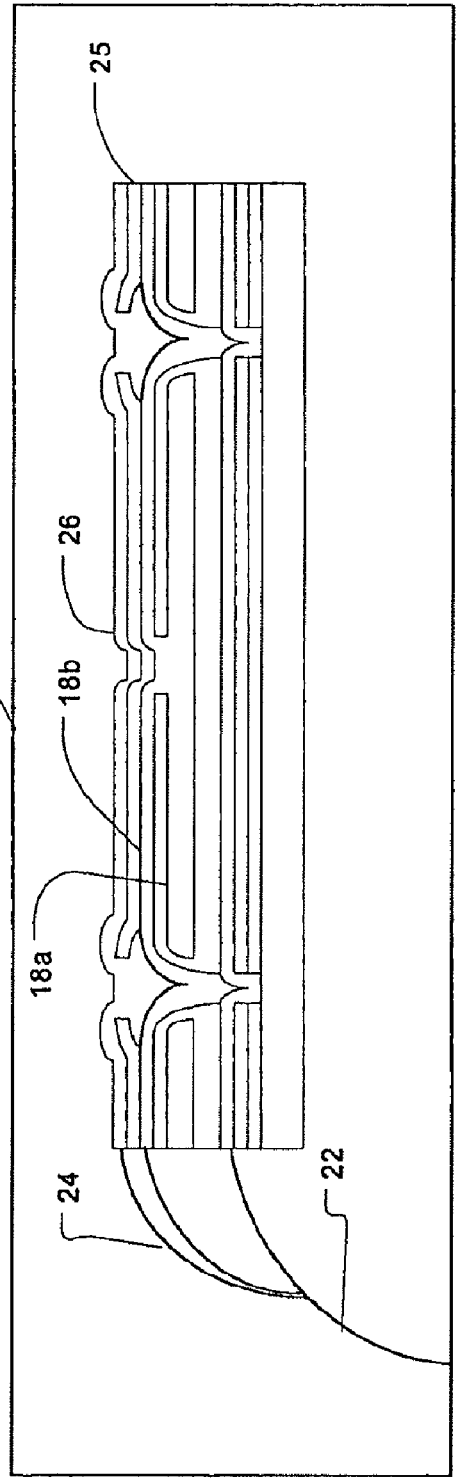
FIG. 4 shows an alternative embodiment of an apparatus to mitigate the effects of static charge during an etch process.

An apparatus for mitigating the build up of electrostatic charge during etching processes is shown in FIG. 3. An alternative embodiment is shown in FIG. 4. In FIG. 3, a conductive wire 22 has been attached to the first and second conductive layers 14 and 18 to hold them at the same potential. The same potential could involve attaching them to a ground plane, or just attaching them together. By holding them at the same potential, the electrostatic charge build up will not cause a differential between the two layers, and will therefore avoid the problem of having the membrane actuate during the etch process. As will be discussed in more detail further, this will typically be done just prior to the etch process, although the two layers could be electrically coupled together at any point prior to the etch process. It may be desirable to restrict the electrical coupling to the inactive area of the substrates upon which the devices are manufactured.

The alternative embodiment of FIG. 4 shows a device being manufactured out of three conductive layers and two isolation layers. In this embodiment of an interferometric modulator, the equivalent to the second conductive layer 18 in FIGS. 1 and 3 is actually two conductive layers 18a and 18b. They are generally deposited as two separate layers but are in physical or electrical connection with each other. This will typically result in the combination of the flex layer and the mirror layer only requiring one connection to be connecting with the other conductive layers. This particular formation may require two isolation layers as the equivalent of the first isolation layer, because an isolation layer may be formed between the layers 18a and 18b in addition to the one formed between layer 18a and the electrode layer 12. The connection between layers 18a and 18b may be formed by a via in the second portion of the first isolation layer. For purposes of discussion here, this isolation layer is not of interest in that the conductive layer deposited upon does not generally need a conductive wire to connect it to the other conductive layers.

A second isolation layer 25 may be formed on the flex layer 18b, to provide a separation between the conductive layer 18b and a third conductive layer 26. The third conductive layer in this example is the bus layer, used to form a signaling bus above the flex and mirror layers to aid in addressing of the cells of the modulator. Regardless of the application or the MEMS device in which embodiments of the invention may be employed, this is just intended as an example of multiple conductive layers being electrically coupled to mitigate or eliminate the electrostatic charge build up during the etch process.

Also shown in FIG. 4 is an alternative to a connection between the two layers alone. In FIG. 24, the conductive wire 22 is attached to a ground plane, in this example the frame of the etch chamber 30. This may be more desirable than having the two or more layers electrically connected together, as they will be to a 'known' potential, that is ground. Alternatively, the conductive wires 22 and 24 could be attached to other structures. As long as the two or more layers are held at the same potential, the build up of electrostatic charge should not cause the membrane to be attracted to the conductive layer on the substrate.

Figure 5:
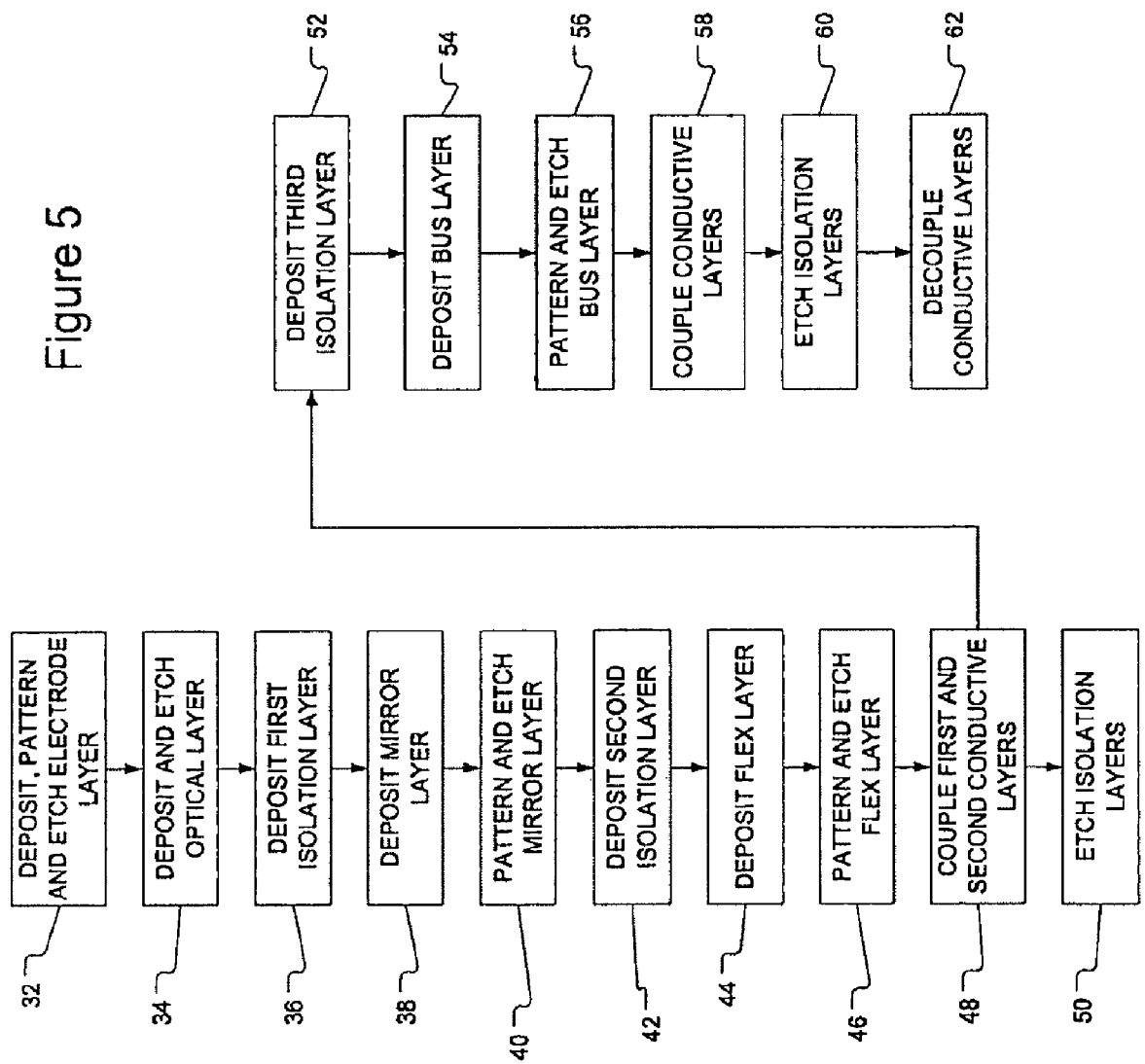
FIG. 5 shows a flowchart of an embodiment of a method to manufacture a microelectromechanical device.

As mentioned previously, it is probably more desirable to use a means of avoiding or mitigating electrostatic charge build up that does not interfere with current process flows for manufacturing of MEMS devices. An example of a method of manufacturing a MEMS device, in this case the interferometric modulator mentioned previously, is shown in flowchart form in FIG. 5.

It must be noted that the process flow given as a particular example in this discussion is for an interferometric modulator. However, embodiments of this invention may be applied to any MEMS device manufacturing flow having isolation layers removed by dry, gas etching. As discussed previously, the interferometric modulator is built upon a transparent substrate such as glass. An electrode layer is deposited, patterned and etched at 32 to form electrodes for addressing the cells of the modulator. The optical layer is then deposited and etched at 34. The first isolation layer is deposited at 36, then the mirror layer at 38. In this example, the first conductive layer will be the mirror layer.

The first conductive layer is then patterned and etched at 40. A second isolation layer is deposited at 42. Again, this is specific to the example of FIG. 4, in which the second conductive layer is actually formed from two conductive layers, the flex layer and the mirror layer. The first and second isolation layers may be treated as one isolation layer, as the electrostatic charge buildup between the conductive layers on either side of the second isolation layer is not a concern. The flex layer is then deposited at 44, and patterned and etched at 46.

At 48, the typical process flow is altered to include the grounding of the first and second conductive layers, in this case the electrode layer and the mirror/flex layer. For a device having two conductive layers and one effective isolation layer, the process may end at 50, with the isolation layer being removed with an etch. This is only one embodiment, and the ending of the process is therefore shown in a dashed box. For a device having more than two conductive layers, the process may instead continue at 52.

At 52, a third isolation layer is deposited at 52 in this particular example. As discussed above, this may actually be only a second, effective isolation layer. The bus layer, or third conductive layer, is deposited at 54, patterned and etched at 56. At 58, the conductive layers, in this example there are three, are grounded or electrically coupled together at 58, and the isolation layers are removed at 60. Depending upon the functionality of the device and the electrical drive scheme, the conductive layers may be decoupled at 62. For the example of the interferometric modulator, where the operation of the device relies upon the electrostatic attraction arising between conductive layers being held at different voltage potentials, the coupling would have to be removed.

The wire coupling is an example of an external process of coupling the conductive layers. Other external examples include using test probe structures to provide coupling between the layers, and the use of an ionized gas, where the molecules of the gas itself provides coupling between the layers.

It must be noted that the process of connecting the layers together, or connecting them all to the same potential is referred to as coupling the layers. This is intended to cover the situations in which the layers are just connected together, connected together to a common potential where that potential includes ground, or connected individually to a common or same potential. No restriction on how the layers are electrically coupled together is in intended.

Figure 6A:
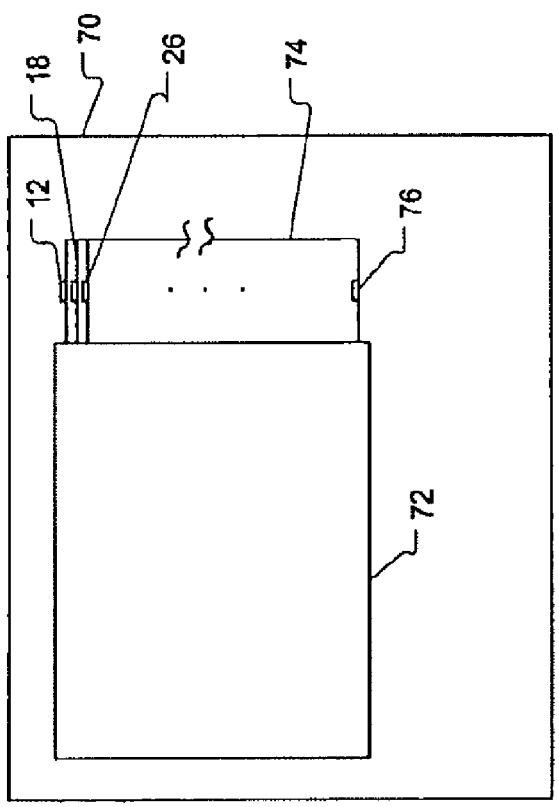
FIGS. 6a and 6b show embodiments of an alternative apparatus to mitigate the effects of static charge during an etch process.
Figure 6B:
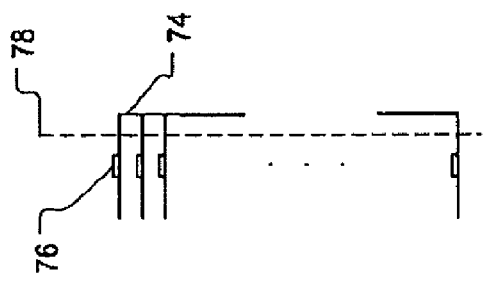

An example of an internal grounding apparatus is shown in FIGS. 6a and 6b. As part of the manufacture of the MEMS devices, typically many devices are manufactured on one substrate, a portion of which is shown at 70 in FIG. 6a. During manufacture of the device, leads may be provided from the various layers, such as the electrode layer 12, the mechanical or mirror layer 18, and the bussing layer 26, of the device to test pads or tabs such as 76. It is possible to couple these pads together, such as by connection 74 that ties all of the pads together, as part of the conductive layer patterning and etching processes of manufacturing the devices. This would couple the conductive layers together for further processing.

As mentioned above, for devices that cannot operate with the layers coupled together, this internal coupling would have to be removed. As shown in FIG. 6b, the connections between the pads 76 and the coupling connection 74 could be broken. When the substrate is divided up into its individual devices, it may be sawn, scribed, or otherwise broken. The lines used to form the breaks, such as the scribe line 78, would sever the coupling between the pads 76 and the coupling connection 74. This is an example of internal coupling.

In this manner, MEMS devices having conductive layers and at least one isolation layer can be etched using current processes while avoiding electrostatic charge build up that may render the devices inoperable. Prior to packaging, and typically upon removal of the device from the etch chamber, the connections are removed or otherwise eliminated from the devices.

Thus, although there has been described to this point a particular embodiment for a method and apparatus for mitigating or eliminating the effects of electrostatic charge during etch processes, it is not intended that such specific references be considered as limitations upon the scope of this invention except in-so-far as set forth in the following claims.

What is claimed is:

1. A method of manufacturing an electromechanical device, the method comprising:
   forming a first conductive layer;
   forming an isolation layer on the first conductive layer;
   forming a second conductive layer on the isolation layer such that the isolation layer is disposed between the first conductive layer and the second conductive layer, wherein the second conductive layer is configured to allow portions of the second conductive layer to deflect towards the first conductive layer and contact the first conductive layer after the isolation layer is removed;
   prior to etching the isolation layer, electrically coupling the first conductive layer to the second conductive layer;
   after the first conductive layer to the second conductive layer are electrically coupled, etching the isolation layer to form a gap between the first and second conductive layers; and
   electrically decoupling the first conductive layer from the second conductive layer after removing the isolation layer.

2. The method of claim 1, wherein performing an etch comprises performing a dry gas etch.

3. The method of claim 1, wherein performing an etch comprises performing a dry vapor-phase etch.

4. The method of claim 1, wherein performing an etch comprises performing a xenon difluoride etch.

5. The method of claim 1, wherein electrically coupling the first conductive layer to the second conductive layer comprises coupling the first and second conductive layers externally.

6. The method of claim 1, wherein electrically coupling the first conductive layer to the second conductive layer comprises coupling the first and second conductive layers together internally.

7. The method of claim 1, wherein electrically coupling the first conductive layer to the second conductive layer comprises electrically coupling the first conductive layer to the second conductive layer in an inactive area of the substrate.

8. The method of claim 1, wherein electrically coupling comprises electrically coupling the first conductive layer to the second conductive layer during fabrication of at least a portion of the electromechanical device.

9. The method of claim 1, further comprising forming a third conductive layer.

10. The method of claim 9, wherein forming the isolation layer comprises forming a first isolation layer and a second isolation layer.

11. The method of claim 1, wherein electrically coupling the first conductive layer to the second conductive layer comprises using a gas.

12. The method of claim 11, wherein the gas is an ionized gas.

13. The method of claim 1, wherein etching the isolation layer comprises performing a vapor-phase etch with a first gas, and wherein electrically coupling the first conductive layer to the second layer together comprises using a second gas.

14. The method of claim 13, wherein the electromechanical device is exposed to both the first gas and the second gas simultaneously during etching.

15. The method of claim 13, wherein the first gas comprises xenon difluoride.

16. The method of claim 13, wherein the second gas is an ionized gas.

17. A method of manufacturing a electromechanical device comprising a first conductive layer, a second conductive layer, and an isolation layer between the first and second conductive layers, the method comprising:
   prior to etching the isolation layer, electrically coupling the first conductive layer to the second conductive layer;
   etching the isolation layer to form a gap between the first and second conductive layers; and
   electrically decoupling the first conductive layer from the second conductive layer after etching the isolation layer.

* * * * *

UNITED STATES PATENT AND TRADEMARK OFFICE
CERTIFICATE OF CORRECTION

| | |
|---|---|
| PATENT NO. | : 7,704,772 B2 |
| APPLICATION NO. | : 12/271793 |
| DATED | : April 27, 2010 |
| INVENTOR(S) | : Ming-Hau Tung et al. |

It is certified that error appears in the above-identified patent and that said Letters Patent is hereby corrected as shown below:

At Item (56), Reference Cited, OTHER PUBLICATIONS, Line 1, please delete "Curcuit-" and insert therefore, --Circuit- --.

At Item (56), Reference Cited, OTHER PUBLICATIONS, Line 19, please delete "modulcation," and insert therefore, --modulation,--.

At Item (56), Reference Cited, OTHER PUBLICATIONS, Line 19, please delete "IEeEE" and insert therefore, --IEEE--.

At Item (56), Reference Cited, OTHER PUBLICATIONS, Line 21, please delete "Systesm," and insert therefore, --System,--.

At Claim 13, Line 4, please insert --conductive-- after "second". (1st occurrence)

Signed and Sealed this
First Day of March, 2011

David J. Kappos
*Director of the United States Patent and Trademark Office*

UNITED STATES PATENT AND TRADEMARK OFFICE
CERTIFICATE OF CORRECTION

PATENT NO. : 7,704,772 B2
APPLICATION NO. : 12/271793
DATED : April 27, 2010
INVENTOR(S) : Ming-Hau Tung et al.

It is certified that error appears in the above-identified patent and that said Letters Patent is hereby corrected as shown below:

At Item (56), Reference Cited, OTHER PUBLICATIONS, Line 1, please delete "Curcuit-" and insert therefore, --Circuit- --.

At Item (56), Reference Cited, OTHER PUBLICATIONS, Line 19, please delete "modulcation," and insert therefore, --modulation,--.

At Item (56), Reference Cited, OTHER PUBLICATIONS, Line 19, please delete "IEEEE" and insert therefore, --IEEE--.

At Item (56), Reference Cited, OTHER PUBLICATIONS, Line 21, please delete "Systesm," and insert therefore, --System,--.

Column 6, line 27 (Claim 13, Line 4) please insert --conductive-- after "second". (1st occurrence)

This certificate supersedes the Certificate of Correction issued March 1, 2011.

Signed and Sealed this
Twenty-ninth Day of March, 2011

David J. Kappos
*Director of the United States Patent and Trademark Office*